United States Patent [19]

Ueno et al.

[11] Patent Number: 5,098,858
[45] Date of Patent: Mar. 24, 1992

[54] JUNCTION BETWEEN METAL AND ZINCBLENDE-TYPE III-V COMPOUND SEMICONDUCTOR AND MANUFACTURING METHOD THEREOF

[75] Inventors: Kazuyoshi Ueno; Kazuyuki Hirose, both of Tokyo, Japan

[73] Assignee: NEC Corporation, Japan

[21] Appl. No.: 545,876

[22] Filed: Jun. 29, 1990

[30] Foreign Application Priority Data

Jun. 30, 1989 [JP] Japan .................. 1-170072

[51] Int. Cl.$^5$ ........................................ H01L 21/44
[52] U.S. Cl. .................... 437/176; 437/39; 437/81; 437/175; 437/177; 437/178; 437/184; 148/DIG. 139; 148/DIG. 140; 156/612
[58] Field of Search ............. 437/176, 175, 177, 39, 437/912, 178, 81, 184; 148/DIG. 139, DIG. 140; 156/612

[56] References Cited

U.S. PATENT DOCUMENTS

| | | | |
|---|---|---|---|
| 3,927,225 | 12/1975 | Cordes et al. | 437/178 |
| 3,935,586 | 1/1976 | Landheer et al. | 437/177 |
| 3,938,243 | 2/1976 | Rosvold | 437/179 |
| 4,011,583 | 3/1977 | Levinstein et al. | 437/184 |
| 4,149,907 | 4/1979 | Wronski et al. | 437/184 |
| 4,179,534 | 12/1979 | Chang et al. | 437/184 |
| 4,226,649 | 10/1980 | Davey et al. | 437/176 |
| 4,724,223 | 2/1988 | Ditchek | 437/178 |
| 4,771,013 | 9/1988 | Curran | 437/174 |
| 4,797,374 | 1/1989 | Scott et al. | 156/612 |
| 4,881,979 | 11/1989 | Lewis | 357/4 |
| 4,935,381 | 6/1990 | Speckman et al. | 437/81 |
| 4,962,050 | 10/1990 | Geissberger et al. | 437/176 |

OTHER PUBLICATIONS

Haberern et al., "GaAs(111)A-(2×2) Reconstruction Studied by Scanning Tunneling Microscope", Physical Review B, vol. 41 #5 pp. 3226-3229, 1990.
Barret et al., "On the Dependence of Schottky Barrier Height and Interface States Upon Initial Semiconductor Surface Parameters in GaAs (001)/Al Junctions," J. Vac. Sci. Technol. B vol. 1 #3 1983 pp. 819-824.
Svenson et al., "Al-GaAs (001) Schottky Barrier Formation," J. Appl. Phys. vol. 54 #1983 pp. 4474-4481.
Missous et al., "The Effects of Vacuum Conditions on Epitaxial Al/GaAs Contacts Formed by Molecular--Beam Epitaxy," J. Appl. Phys. vol. 60 #7 1986 pp. 2439-2444.
Sze, *Physics of Semiconductor Devices*, Wiley Interscience Publication, N.Y., 1981, pp. 274-277.

*Primary Examiner*—Brian E. Hearn
*Assistant Examiner*—Kevin Picardat
*Attorney, Agent, or Firm*—Laff, Whitesel, Conte & Saret

[57] ABSTRACT

The method of manufacturing the metal-semiconductor junction in accordance with the present invention includes the step of forming a 2×2 surface superstructure in an ultrahigh vacuum by removing an oxide layer by means of a heat cleaning at temperatures not lower than 600° C. while irradiating a (111) A or (111) B surface of a zincblende-type III-V compound semiconductor substrate with a beam of a group V element, the step of cooling the substrate down to room temperature while maintaining the surface superstructure and the step of depositing a metal on the surface.

12 Claims, 2 Drawing Sheets

JUNCTION BETWEEN METAL AND ZINCBLENDE-TYPE III-V COMPOUND SEMICONDUCTOR AND MANUFACTURING METHOD THEREOF

BACKGROUND OF THE INVENTION

The present invention relates to a junction between a metal and a III-V compound semiconductor and a manufacturing method thereof, and more particularly to a Schottky junction between a metal and a zincblende-type III-V compound semiconductor and a manufacturing method thereof.

DESCRIPTION OF THE RELATED ART

The Schottky type metal-semiconductor junction is being used widely as the gate junctions for compound semiconductor diodes represented by GaAs or metal-semiconductor field effect transistors (MESFETs). In the case of GaAs in particular, because of the difficulty in forming a satisfactory metal-insulator-semiconductor (MIS) structure due to the presence of numerous interface levels in the surface, active developments of MESFETs as high speed logic elements or high frequency amplifier elements are being pursued with a result that some of them already being put into practical use.

Conventionally, Schottky junctions for GaAs, and MESFETs making use thereof, have been manufactured by employing (100) substrates as disclosed, for example, in Journal of Applied Physics, Vol. 60, (1986), pp. 2439-2444, Journal of Vacuum Science and Technology B. Vol. 1, (1983), pp. 819-824 and Journal of Applied Physics, Vol. 54, (1983), pp. 4474-4481. The characteristic of a Schottky gate is represented by Schottky barrier height ($\phi_b$). In the case of Schottky barriers for GaAs manufactured in accordance with the conventional method, it has generally been known that the value of $\phi_b$ is approximately constant regardless of the kind of a metal deposited, as shown in Physics of Semiconductor Devices, John Wiley & Sons, Inc., 1981, p. 276.

Now, to be capable of stably varying the value of $\phi_b$ as a parameter will become important in device design in such cases as in the following.

Namely, in the case of a logic circuit element using the MESFETs, high level of the voltage applicable to their gate electrodes is determined by $\phi_b$, so that is becomes necessary to improve the value of $\phi_b$ in order to secure an operating margin which is sufficient for enhancing the integration scale. On the other hand, in forming an ohmic junction, it becomes necessary to lower the contact resistance by reducing the barrier height. However, in the Schottky junction according to the ordinary manufacturing method that utilizes the conventional (100) surface, there has been a problem that it is difficult to vary the value of $\phi_b$, as mentioned in conjunction with the prior art. In addition, there has been a problem that it is difficult to stably produce variable values of $\phi_b$ with satisfactory controllability.

SUMMARY OF THE INVENTION

It is, therefore, an object of the present invention to provide metal-semiconductor junctions with varied barrier heights as well as a manufacturing method thereof which stably produces barrier heights with satisfactory controllability.

A first metal-semiconductor junction in accordance with the present invention is characterized in that in a junction between a metal and a zincblende-type III-V compound semiconductor, the orientation of the surface of the compound semiconductor is a (111) A surface and the semiconductor surface superstructure at the time of formation of the junction is 2×2.

A second metal-semiconductor junction in accordance with the present invention is characterized in that in a junction between a metal and a zincblende-type III-V compound semiconductor, the orientation of the surface of the compound semiconductor is a (111) B surface and the semiconductor surface superstructure at the time of formation of the junction is 2×2.

The method of manufacturing the first metal-semiconductor junction of the present invention includes the step of forming a surface superstructure of 2×2 on the (111) A surface of the zincblende-type III-V compound semiconductor, and the step of depositing a metal on top of it.

Further, the method of manufacturing the second metal-semiconductor junction of the present invention includes the step of forming a surface superstructure of 2×2 on the (111) B surface of the zincblende-type III-V compound semiconductor, and the step of depositing a metal on top of it.

The 2×2 surface superstructure is preferable to be formed by removing an oxide layer by thermal etching at temperatures not lower than 600° C. while irradiating the (111) A or (111) B surface of the III-V compound semiconductor with a beam of a group V element. Moreover, the metal is preferable to be deposited subsequent to the thermal etching and after cooling the substrate to room temperature while maintaining the 2×2 surface superstructure. Furthermore, these steps are preferably carried out in an ultrahigh vacuum.

Among the (111) surfaces of a zincblende-type III-V compound semiconductor, there are two types, namely, the (111) A surface that has the group III element as the terminal surface and the (111) B surface that has the group V element as the terminal surface. As a result of an intensive study by the present inventors there was uncovered an experimental result that the deposition of a metal on the 2×2 superstructure that appears on the (111) A surface and the (111) B surface induces an amelioration of $\phi_b$ for the surface A and a deterioration for the surface B. Furthermore, it was also found that a stabilized and excellent 2×2 superstructure can be realized by a thermal etching at temperatures not lower than 600° C., and that a satisfactory junction can be obtained in stable fashion by a cooling step to the room temperature and a metal deposition step in an ultrahigh vacuum.

The first metal-semiconductor junction of the present invention is obtained based on the property that the (111) A surface is stable in the state where it terminates with a group III element and an experimental finding that the 2×2 structure that appears on the (111) A surface provides a surface that enhances $\phi_b$. Here, the pinning position of the Fermi level of the surface is shifted toward the top of the valence band, and as a result it becomes possible to improve the Schottky barrier height. Due to this effect, when a logic circuit is constructed with GaAs MESFETs that use the junction of the present invention for the gate junction, there can be brought about a marked effect for enhancing the integration scale of the integrated circuits such as enlarging the bounds of the positive potential applicable to the gate electrode and increasing the logic swing. Moreover, in accordance with the method of manufacturing the first metal-semiconductor junction of the present invention, it is possible to realize a 2×2 superstructure on the (111) A surface with excellent reproducibility, and to stably produce a junction with high value of $\phi_b$.

Further, the second metal-semiconductor junction of the present invention is obtained based on the property that the (111) B surface is stable in the state where it terminates with a group V element and an experimental finding that the value of $\phi_b$ is reduced in the Schottky junction on the 2×2 superstructure that appears on the (111) B surface. When the junction of the present invention is used as an ohmic junction, for example, it is possible to realize a reduction of the contact resistance by the lowering of the barrier height. This leads to a reduction of the parasitic resistance of the elements such as an FET, whereby giving rise to an effect that realizes an enhancement of the element performance. Further, in accordance with the method of manufacturing the second metal-semiconductor junction of the present invention, it is possible to stably manufacture junctions with low values of $\phi_b$ by realizing a 2×2 superstructure with excellent reproducibility on the (111) B surface.

BRIEF DESCRIPTION OF THE DRAWINGS

The above and further objects, features and advantages of the present invention will become more apparent from the following detailed description taken in conjunction with the accompanying drawings, wherein.

DESCRIPTION OF THE PREFERRED EMBODIMENTS (Embodiments)

The first metal-semiconductor junction in accordance with the present invention and the manufacturing method thereof will be described in what follows with the junction between Al and GaAs as an example.

Figure 1:
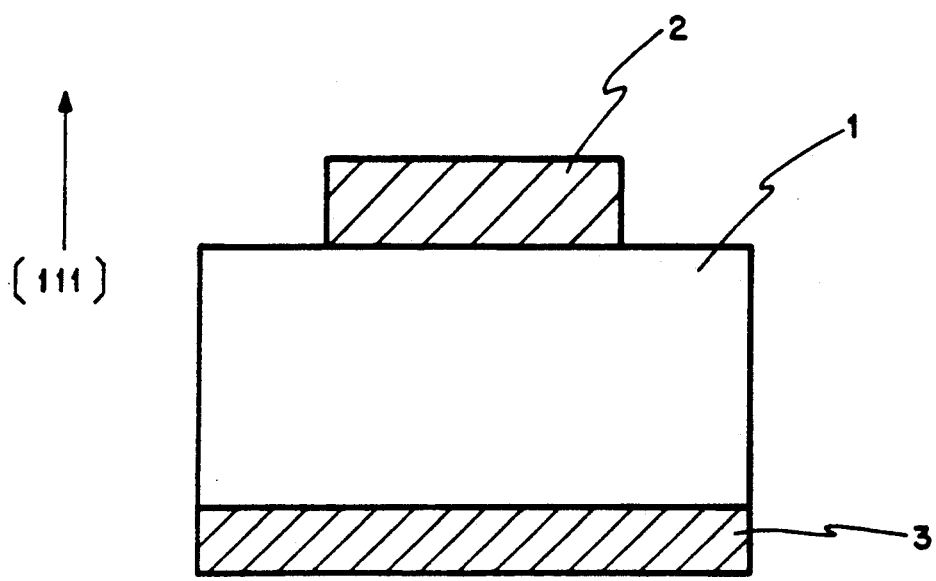
FIG. 1 is a sectional view showing an embodiment of a diode that uses the first metal-semiconductor junction of the present invention.

FIG. 1 is a sectional view of a vertical diode that uses the junction between Al and GaAs in accordance with the present invention. On a surface of an n-type GaAs (111) A substrate 1 doped with $2 \times 10^{17}$ cm$^{-3}$ of Si, an Al electrode 2 is formed, and an ohmic electrode 3 is formed on the rear surface of the substrate 1.

The junction shown in FIG. 1 is manufactured as in the following. After removing the surface layer of a mirror polished GaAs (111) A surface with sulfuric acid etching solution, a spontaneously oxidized film is removed using hydrochloric acid. Then, the sample is introduced into a molecular beam epitaxy (MBE) system, pre-heated at 300° C., and starting with the temperature at 500° C. the substrate is irradiated with an As beam of As pressure of $1 \times 10^{-5}$ Torr until the substrate temperature reaches 650° C. An excellent 2×2 surface superstructure is obtained by this process. The oxide film is removed for several minutes until there is revealed the 2×2 surface superstructure while monitoring the reflection high energy electron diffraction (RHEED) pattern. Following that the substrate is cooled down to room temperature, with an irradiation of an As beam until the substrate temperature of 500° C. and with the irradiation of the As beam turned off below 500° C. Subsequently, polycrystalline Al 2 is deposited at the deposition rate of 0.025 μm/hour to about 200 nm thickness by evaporation to form a junction. Further, an ohmic electrode 3 is formed on the reverse side of the substrate 1 according to the ordinary method, completing a vertical diode as shown in FIG. 1. The value of $\phi_b$ as determined from the result of the current-voltage measurement in an experiment by the present inventors was formed to be 0.87 eV. Since the value of $\phi_b$ for the case of the (100) surface substrate is 0.76 eV, there was realized an increase in the value of $\phi_b$ of 0.11 eV.

Figure 2:
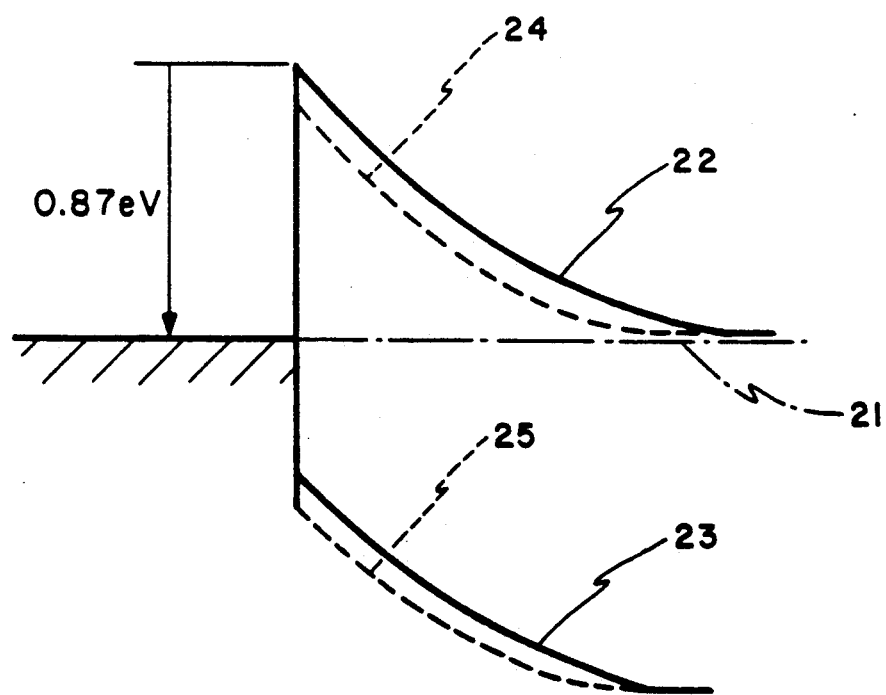
FIG. 2 is a schematic diagram showing the band structure in the vicinity of the junction in accordance with the first metal-semiconductor junction of the present invention.

In this case, a schematic diagram for the band in thermal equilibrium in the vicinity of the junction is as shown in FIG. 2. It is considered that the pinning position of the Fermi level 21 is at 0.87 eV from the conduction band edge 22 of the present invention, at the interface, and that the conduction band edge 22 and the valence band edge 23 of the present invention are at potentials that are higher respectively by 0.11 eV than the conduction band edge 24 and the value band edge 25 of the conventional junction on the GaAs (100) surface.

Figure 3:
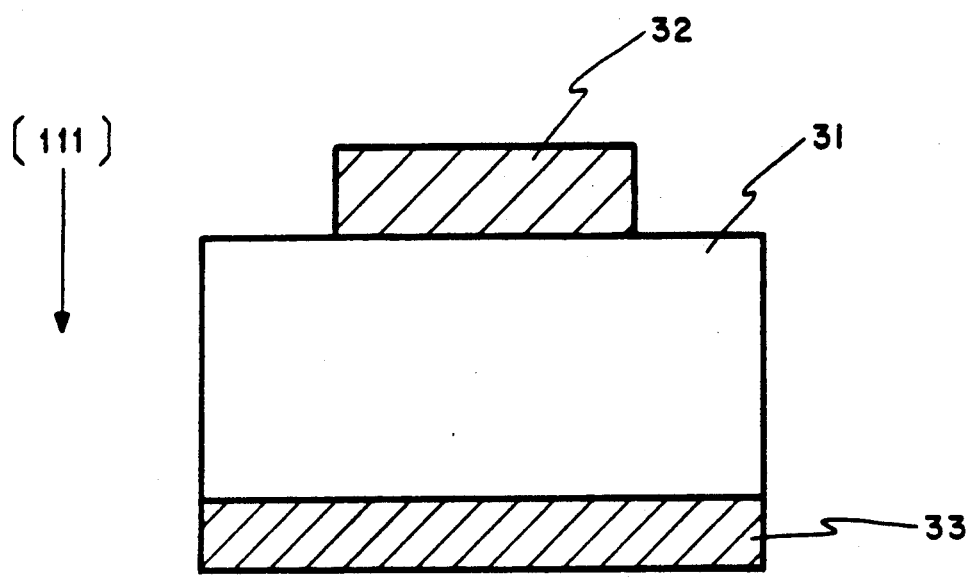
FIG. 3 is a sectional view showing an embodiment of a diode that uses the second metal-semiconductor junction of the present invention.

Further, the second metal-semiconductor junction of the present invention and the manufacturing method thereof will be described with the junction between Al and GaAs as an example. FIG. 3 is a sectional view of a vertical diode that uses the Al-GaAs junction in accordance with the present invention. In FIG. 3, on a surface of an n-type GaAs (111) B substrate 31, there is formed an Al layer 32, and on the opposite surface of the substrate there is formed an ohmic electrode 33. The junction in FIG. 3 is manufactured as will be described below. After removal of a native oxide film on a mirror polished GaAs (111) B surface in a manner similar to the above, a 2×2 surface superstructure is obtained by a process analogous to the (111) A surface in the above except that the substrate temperature is raised to 630° C. After cooling the substrate down to the room temperature in a manner similar to the above embodiment, a junction is formed by depositing polycrystalline Al at a deposition rate of 0.025 μm/hour to a thickness of about 200 nm by evaporation. A vertical diode as shown in FIG. 3 is completed by further forming an ohmic electrode 33 on the rear surface according to the ordinary method. The value of $\phi_b$ as determined from the result of the current-voltage measurement in an experiment by the present inventors turned out to be 0.67 eV. Since the value of $\phi_b$ in the case of the (100) surface substrate is 0.76 eV, there is realized a reduction of 0.09 eV in the value of $\phi_b$. As a result, the contact resistance of the present invention becomes about 1/6 of the conventional case.

Figure 4:
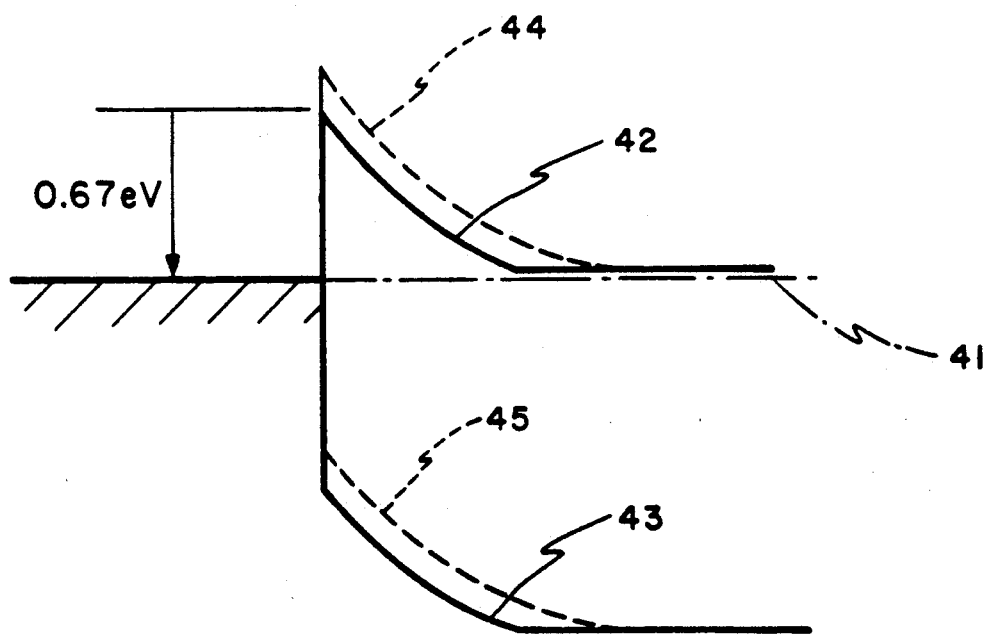
FIG. 4 is a schematic diagram showing the band structure in the vicinity of the junction in accordance with the second metal-semiconductor junction of the present invention.

A schematic representation of the band in thermal equilibrium in the vicinity of the junction for this case is as shown in FIG. 4. It is considered that the pinning position of the Fermi level 41 is at 0.67 eV from the conduction band edge 42 of the present invention, at the interface, and that the conduction band edge 42 and the valence band edge 43 of the present invention are at potentials that are lower respectively by 0.09 eV than the conduction band edge 44 and the valence band edge 45.

In the foregoing embodiments, the Al films 2 and 32 were evaporated at a low deposition rate of 0.025 μm/hour to deposit the Al films 2 and 32 in a polycrystalline form. When Al film are evaporated at a higher deposition rate of 0.12 μm/hour onto GaAs (111) surfaces having a 2×2 surface superstructure, single crystalline Al films are formed on both (111) A and B surfaces, and the value of $\phi_b$ was found to be 0.84 eV, which is higher by 0.08 eV than the conventional junction on the GaAs (100) surface, for both (111) A and B surfaces. Therefore, Schottky junctions having large Schottky barrier heights can be obtained for both (111) A and B surfaces by forming single crystalline Al film thereon.

It should be noted that an effect similar to the above can be obtained for metal-semiconductor combinations other than the Al-GaAs junction employed in conjunction with the description of the embodiments. Namely, numerous combinations are possible for metals such as Au, Ag, W, WSi, WAl and WN and semiconductors such as $Al_xGa_{1-x}As$, InAs and GaSb.

What is claimed is:

1. A method of manufacturing a metal-semiconductor junction comprising:
   the step of forming a 2×2 surface superstructure on a (111) A surface of a zincblende-type III-V compound semiconductor; and
   the step of depositing a metal on said surface superstructure.

2. A method of manufacturing a metal-semiconductor junction comprising:
   the step of forming a 2×2 surface superstructure on a (111) B surface of a zincblende-type III-V compound semiconductor; and
   the step of depositing a metal on said surface superstructure.

3. A method of manufacturing a metal-semiconductor junction as claimed in claim 1, wherein said 2×2 surface superstructure is formed in an ultrahigh vacuum by removing an oxide layer by means of a thermal etching at temperatures not lower than 600° C. while irradiating the (111) surface of said zincblende-type III-V compound semiconductor with a beam of a group V element.

4. A method of manufacturing a metal-semiconductor junction as claimed in claim 2, wherein said 2×2 surface superstructure is formed in an ultrahigh vacuum by removing an oxide layer by means of a thermal etching at temperatures not lower than 600° C. while irradiating the (111) B surface of said zincblende-type III-V compound semiconductor with a beam of a group V element.

5. A method of manufacturing a metal-semiconductor junction as claimed in claim 1, further comprising the step of cooling said zincblende-type III-V compound semiconductor down to room temperature, after the formation of said 2×2 surface superstructure and prior to the deposition of a metal on said surface superstructure, while maintaining said 2×2 surface superstructure.

6. A method of manufacturing a metal-semiconductor junction as claimed in claim 2, further comprising the step of cooling said zincblende-type III-V compound semiconductor down to room temperature, after the formation of said 2×2 surface superstructure and prior to the deposition of a metal on said surface superstructure, while maintaining said 2×2 surface superstructure.

7. A method of manufacturing a metal-semiconductor junction as claimed in claim 5, wherein said cooling step to the room temperature is a step in which, after the formation of the 2×2 surface superstructure, cooling is performed while irradiating the (111) A surface of said zincblende-type III-V compound semiconductor for temperatures down to 500° C., and cooling is performed without the irradiation of the As beam for temperature below 500° C.

8. A method of manufacturing a metal-semiconductor junction as claimed in claim 6, wherein said cooling step to the room temperature is a step in which, after the formation of the 2×2 surface superstructure, cooling is performed while irradiating the (111) B surface of said zincblende-type III-V compound semiconductor for temperatures down to 500° C., and cooling is performed without the irradiation of the As beam for temperatures below 500° C., and cooling is performed without the irradiation of the As beam for temperatures below 500° C.

9. A method of manufacturing a semiconductor device comprising:
   the step of forming a 2×2 surface superstructure on a (111) A surface of a zincblende-type III-V compound semiconductor; and
   the step of depositing a metal on said surface superstructure.

10. A method of manufacturing a semiconductor device comprising:
    the step of forming a 2×2 surface superstructure on a (111) B surface of a zincblende-type III-V compound semiconductor; and
    the step of depositing a metal on said surface superstructure.

11. A method of manufacturing a semiconductor device as claimed in claim 9, wherein said 2×2 surface superstructure is formed in an ultrahigh vacuum by removing an oxide layer by means of a thermal etching at temperatures not lower than 600° C. while irradiating the (111) A surface of said zincblende-type III-V compound semiconductor with a beam of a group V element.

12. A method of manufacturing a semiconductor device as claimed in claim 10, wherein said 2×2 surface superstructure is formed in an ultrahigh vacuum by removing an oxide layer by means of a thermal etching at temperatures not lower than 600° C. while irradiating the (111) B surface of said zincblende-type III-V compound semiconductor with a beam of a group V element.

* * * * *